(12) United States Patent
Kim et al.

(10) Patent No.: US 7,682,758 B2
(45) Date of Patent: Mar. 23, 2010

(54) REFLECTION MASK FOR EUV PHOTOLITHOGRAPHY AND METHOD OF FABRICATING THE REFLECTION MASK

(75) Inventors: Suk-pil Kim, Yongin-si (KR); I-hun Song, Seongnam-si (KR); Young-soo Park, Suwon-si (KR); Seung-hyuk Chang, Seongnam-si (KR); Hoon Kim, Siheung-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 593 days.

(21) Appl. No.: 11/441,835

(22) Filed: May 26, 2006

(65) Prior Publication Data

US 2006/0281017 A1 Dec. 14, 2006

(30) Foreign Application Priority Data

May 27, 2005 (KR) ...................... 10-2005-0045218

(51) Int. Cl.
*G03F 1/00* (2006.01)
(52) U.S. Cl. .......................................... 430/5; 430/311
(58) Field of Classification Search .................... 430/5, 430/311, 322, 324; 378/34, 35
See application file for complete search history.

(56) References Cited

U.S. PATENT DOCUMENTS

| | | | | |
|---|---|---|---|---|
| 6,593,037 | B1 * | 7/2003 | Gabriel et al. ................. | 430/5 |
| 6,645,679 | B1 * | 11/2003 | La Fontaine et al. ........... | 430/5 |
| 2003/0027053 | A1 * | 2/2003 | Yan ............................... | 430/5 |
| 2003/0031937 | A1 * | 2/2003 | Yan ............................... | 430/5 |
| 2004/0062999 | A1 * | 4/2004 | Stearns et al. ................. | 430/5 |
| 2004/0175633 | A1 * | 9/2004 | Shoki et al. .................... | 430/5 |
| 2005/0084768 | A1 * | 4/2005 | Han et al. ...................... | 430/5 |
| 2005/0147894 | A1 * | 7/2005 | Lee ................................ | 430/5 |

\* cited by examiner

*Primary Examiner*—Mark F Huff
*Assistant Examiner*—Stewart A Fraser
(74) *Attorney, Agent, or Firm*—F. Chau & Associates, LLC.

(57) ABSTRACT

A reflection mask for extreme ultraviolet (EUV) photolithography and a method of fabricating the same, in which the reflection mask includes a substrate, a lower reflection layer formed in a multi-layer structure on the substrate and including a material reflecting EUV light, an upper reflection layer formed in a multi-layer structure on the lower reflection layer and reflecting EUV light, and a phase reversing layer formed between the lower reflection layer and the upper reflection layer in a certain pattern and causing destructive interference between reflection light from the upper reflection layer and reflection light from the lower reflection layer. An incidence of a shadow effect can be reduced and unnecessary EUV light can be eliminated, so that a pattern on the reflection mask can be projected precisely on a silicon wafer. Since the phase reversing layer includes the same material as the reflection layer and an absorption layer, mask fabrication processes can be handled easily.

12 Claims, 15 Drawing Sheets

REFLECTION MASK FOR EUV PHOTOLITHOGRAPHY AND METHOD OF FABRICATING THE REFLECTION MASK

CROSS-REFERENCE TO RELATED PATENT APPLICATION

This application claims the benefit of Korean Patent Application No. 10-2005-0045218, filed on May 27, 2005, in the Korean Intellectual Property Office, the disclosure of which is incorporated herein in its entirety by reference.

BACKGROUND OF THE INVENTION

1. Technical Field

The present disclosure relates to a reflection mask for extreme ultraviolet (EUV) photolithography and a method of fabricating the same, and more particularly, to a reflection mask for EUV photolithography and a method of fabricating the reflection mask, wherein a high resolution pattern can be formed via destructive interference of unnecessary EUV light by forming an additional multi-layer, which can reverse a phase of the EUV light, and wherein the additional multi-layer is formed between a reflection layer and an absorption layer.

2. Discussion of the Related Art

Recently, the large integration scale of semiconductor devices has led to an increased use of light of shorter wavelengths in a photolithography device fabrication process. In a conventional photolithography method, EUV light is used to realize a design size of 100 nm or less.

Since most substances have a high light absorptivity at a EUV ray region, photolithography using EUV light requires a reflection mask that is different than a typical mask. A conventional reflection mask for EUV light is obtained by forming a pattern, made of a material that can absorb EUV light, on a reflection surface having a high reflection index to EUV light. The region of the reflection surface where the pattern of the absorption material is formed constitutes an EUV light absorption region, while an exposed region of the reflection surface where the pattern of the absorption material is not formed constitutes an EUV light reflection region. EUV light reflected from the reflection surface is transmitted to a photoresist material on a substrate in order to form a photoresist pattern in the same shape as the pattern of the absorption material. This is typically how the photolithography process for semiconductor fabrication is performed.

FIG. 1 is a cross-sectional view illustrating a structure of a reflection mask 1 for EUV photolithography.

The reflection mask 1 includes a substrate 2, a reflection layer 4 formed on the substrate 2, and an absorption material pattern 6 formed on the reflection layer 4. The substrate 2 is formed of a material such as silicon or glass.

The reflection layer 4 is formed in a multi-reflection layer structure, wherein different types of layers such as molybdenum and silicon (Mo/Si) or Beryllium and silicon (Be/Si) are arranged alternately over each other. The absorption material pattern 6 is formed of tantalum nitride that can absorb EUV light, and a layer of tantalum nitride is applied in a pattern to make an absorption region for EUV light.

The absorption material pattern 6 has a height H1 of approximately 100 nm. Since the height H1 of the absorption material pattern 6 is relatively large, an impinging angle θ1 also becomes large. Thus, quite often, a photoresist layer applied to a thin film 10 on a silicon wafer 8 that is being manufactured cannot be exposed to the EUV light reflected from the reflection layer 4 and, thus, an intended pattern shape cannot be obtained. This event is called "a shadow effect."

Performing an EUV photolithography process using the reflection mask 1 may cause a size D1 of the absorption material pattern 6 and a size D2 of a photoresist pattern 12 formed on the silicon wafer 8 to be different from each other. In this exemplary case, the size D1 of the absorption material pattern 6 is larger than the size D2 of the photoresist pattern 12.

Since the photoresist layer applied on the thin film 10 is overly exposed to EUV light, the height of the photoresist pattern 12 is lowered. Thus, in many cases, the photoresist pattern 12 may not function as a mask in a subsequent etching process. The cause of this limitation is that the absorption material pattern 6 does not absorb EUV light completely and, thus, the photoresist layer formed on thin film 10 applied to the silicon wafer 8 is exposed to EUV light a reflected from the surface of the absorption material pattern 6 and to EUV light b transmitted through the absorption material pattern 6 and then reflected from the surface of the reflection layer 4.

In other words, due to the shadow effect and the unnecessary EUV light beams a and b, the photoresist on the thin film 10 layer results in a photoresist pattern 12 that is formed to have different width or height from the intended ones. Hence, when an etching process is performed using the photoresist pattern 12 as a mask, a pattern is formed on the thin film layer 10 having a different width or height from the intended pattern.

SUMMARY OF THE INVENTION

Embodiments of the present invention provide a reflection mask for EUV photolithography and a method of fabricating the same, by which a photoresist layer formed on a silicon wafer can be precisely patterned in a shape substantially identical to a pattern formed on a reflection mask.

According to an embodiment of the present invention, there is provided a reflection mask for extreme ultraviolet (EUV) photolithography, including: a substrate; a lower reflection layer formed in a multi-layer structure on the substrate and including a material that can reflect EUV light; an upper reflection layer formed in a multi-layer structure on the lower reflection layer and capable of reflecting EUV light; and a phase reversing layer formed in a predetermined pattern between the lower reflection layer and the upper reflection layer and causing destructive interference between reflection light from the upper reflection layer and reflection light from the lower reflection layer.

The upper reflection layer and the lower reflection layer may be formed by repeatedly forming two or more layers having different refraction indices. The two or more layers may include molybdenum (Mo) and silicon (Si).

The phase reverse layer may be formed to have a phase difference between EUV light reflected from the lower reflection layer and EUV light reflected from the upper reflection layer in a range of approximately 180 degrees.

The phase reversing layer may have a single layer structure or a multi-layer structure.

The phase reverse layer may include one selected from the group consisting of a single Mo layer, a single Si layer and a multi-layer structure of Mo/Si.

The phase reversing layer may have a thickness less than approximately 100 nm.

According to an embodiment of the present invention, there is provided a method of fabricating a reflection mask for EUV photolithography, including: preparing a substrate; forming a lower reflection layer in a multi-layer structure on the substrate using a material that can reflect EUV light; forming a phase reversing layer in a predetermined pattern on the lower reflection layer; and forming an upper reflection layer in a multi-layer structure on the phase reversing layer and exposed portions of the lower reflection layer.

The forming of the phase reversing layer in the predetermined pattern may include: forming the phase reversing layer on the lower reflection layer; forming a photoresist layer on the phase reversing layer; patterning the photoresist layer to form a photoresist pattern; performing an etching process on the phase reversing layer using the photoresist pattern as a mask; and removing the photoresist pattern.

The upper and lower reflection layers, the phase reversing layer, and an absorption layer may be formed using one selected from the group consisting of a DC (direct current) magnetron sputtering method, a RF (radio frequency) magnetron sputtering method and an ion beam sputtering method.

BRIEF DESCRIPTION OF THE DRAWINGS

Exemplary embodiments of the present invention can be understood in more detail from the following descriptions taken in conjunction with the attached drawings in which.

DETAILED DESCRIPTION OF THE INVENTION

Figure 2:
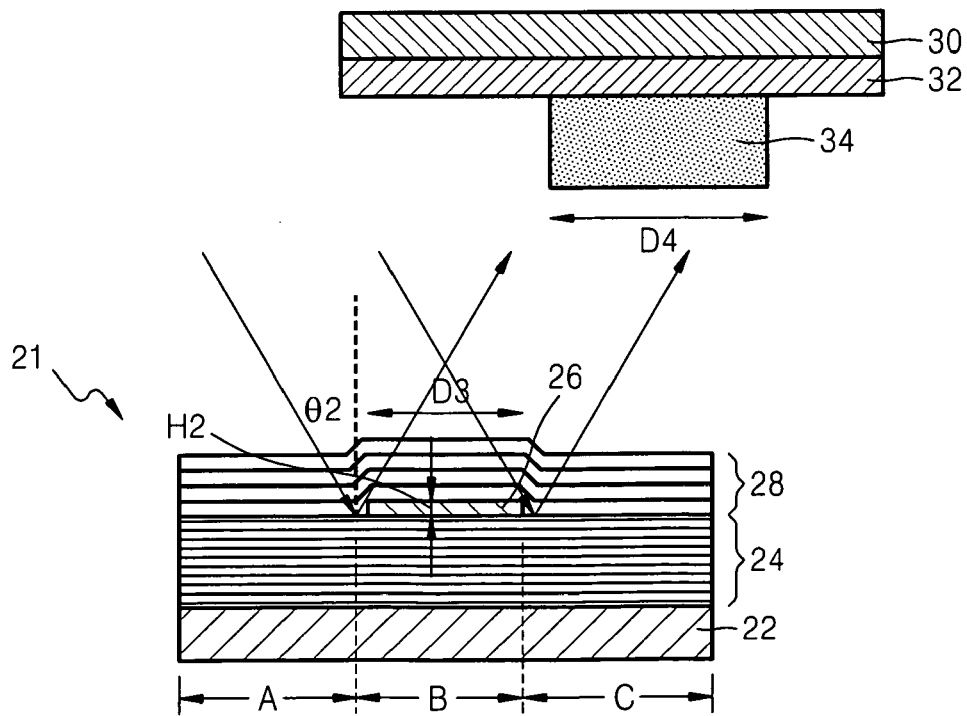
FIG. 2 is a cross-sectional view illustrating a structure of a reflection mask for EUV photolithography according to an embodiment of the present invention.

Exemplary embodiments of the present invention are described more fully with reference to the accompanying drawings. FIG. 2 is a cross-sectional view illustrating a structure of a reflection mask 21 for EUV photolithography according to an embodiment of the present invention.

The reflection mask 21 according to the present embodiment includes a substrate 22, an upper reflection layer 28 and a lower reflection layer 24 formed on the substrate 22, and a phase reversing layer 26. The substrate 22 is formed of silicon or glass, and the phase reversing layer 26 is formed to have a predetermined pattern size in a predetermined region located between the upper reflection layer 28 and the lower reflection layer 24. Reference numerals 30, 32, and 34 denote a silicon wafer, a thin film, and a photoresist pattern, respectively.

The upper reflection layer 28 and the lower reflection layer 24 include multiple layers of molybdenum (Mo) and silicon (Si) alternately and repeatedly applied over each other. Even though the uppermost layer of the upper and lower reflection layers 28 and 24 can be either a Mo layer or a Si layer, the uppermost layer may be a silicon layer since a native oxide layer formed on silicon has good stability. The thickness of each of the Mo layer and the Si layer is in the range of several nanometers, and the Mo and Si layers may be stacked multiply in several tens of levels.

The phase reversing layer 26 is a single Mo or Si layer or multiple layers of Mo and Si alternately applied over each other. The phase reversing layer 26 may include any material with a certain thickness that can transform a phase of EUV light.

In the exemplary embodiment, the reflection mask 21 includes the phase reversing layer 26 reversing the phase of EUV light. The phase reversing layer 26 is configured to make EUV light, that is not needed for forming the photoresist pattern 34 on the thin film 32 formed over the silicon substrate 30, disappear via destructive interference. EUV light reflected in a reflection region A and EUV light destructed in a phase-change destruction region B are coherent, and thus, a size D4 of the photoresist pattern 34 is substantially the same as the pattern size D3 of the phase reversing layer 26 formed on the reflection mask 21 (i.e., D3=D4).

Figure 1:
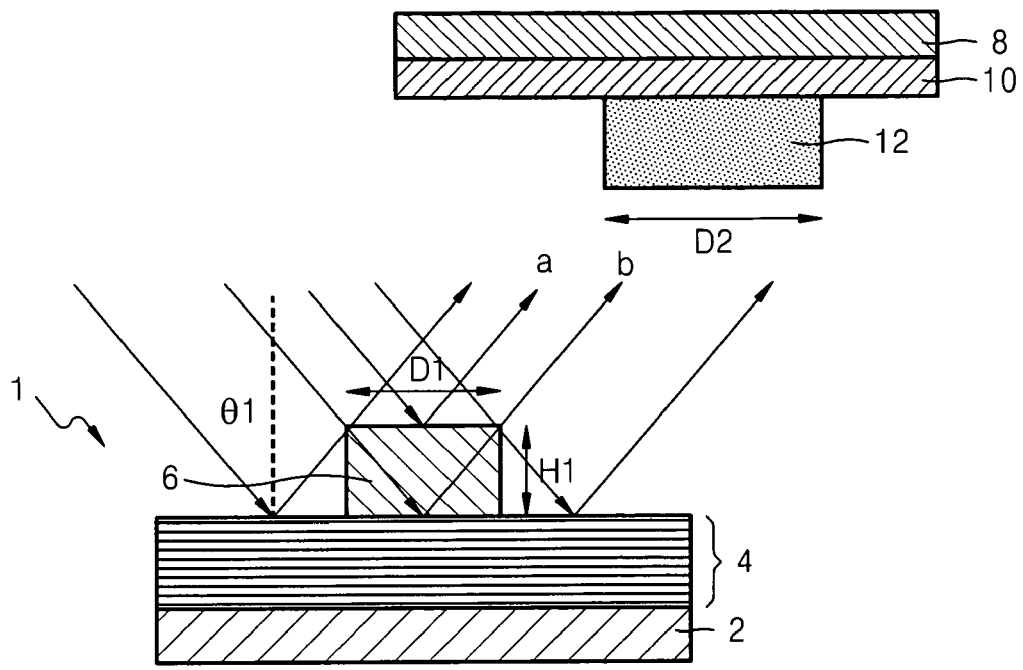
FIG. 1 is a cross-sectional view illustrating a structure of a conventional reflection mask for EUV photolithography.

As compared with the height H1 of the conventional absorption material pattern illustrated in FIG. 1, a height H2 of the phase reversing layer 26 according to the present embodiment is small, and thus, an impinging angle θ2 of EUV light also becomes small. As a result, the pattern on the reflection mask 21 (i.e., the phase reversing layer 26) is projected precisely on a photoresist layer covering the thin film 32 on the silicon wafer 30.

A fabrication method of the reflection mask 21 including the phase reversing layer 26 will be described in detail hereinbelow with reference to FIGS. 7A through 7F.

The phase reversing layer 26 is formed to have a phase difference between EUV light reflected from the lower reflection layer 22 and EUV light reflected from the upper reflection layer 28 that is approximately 180 degrees.

The phase reversing layer 26 may be formed as a single layer or multi-layer structure. For instance, the phase reversing layer 26 may be a single layer of Mo or Si or a multi-layer structure of Mo/Si. The phase reversing layer 26 may have a thickness less than approximately 100 nm.

As for the upper reflection layer 28, the number of the stacked Mo and Si layers may vary depending on the thickness of the phase reversing layer 26. Hereinafter, an exemplary embodiment on the relationship between the number of the stacked Mo and Si layers and the thickness of the phase reversing layer 26 will be described.

If the Mo layer serving as the phase reversing layer 26 has a thickness of approximately 7.42 nm, the total number of repeatedly stacked pairs of the Mo and Si layers of the upper reflection layer 28 is approximately 13. If the Si layer serving as the phase reversing layer 26 has a thickness of approximately 8.31 nm, the total number of repeatedly stacked pairs of the Mo and Si layers is approximately 14.

FIGS. 3A through 6H are graphs illustrating experimental results for the reflection mask 21 of FIG. 2, according to an embodiment of the present invention.

In the exemplary experiments, the lower reflection layer 24 includes a Si layer with a thickness of approximately 4.1 nm and a Mo layer with a thickness of approximately 2.8 nm, and the total number of the repeatedly stacked pairs of the Mo and Si layers is approximately 40.

Figure 3A:
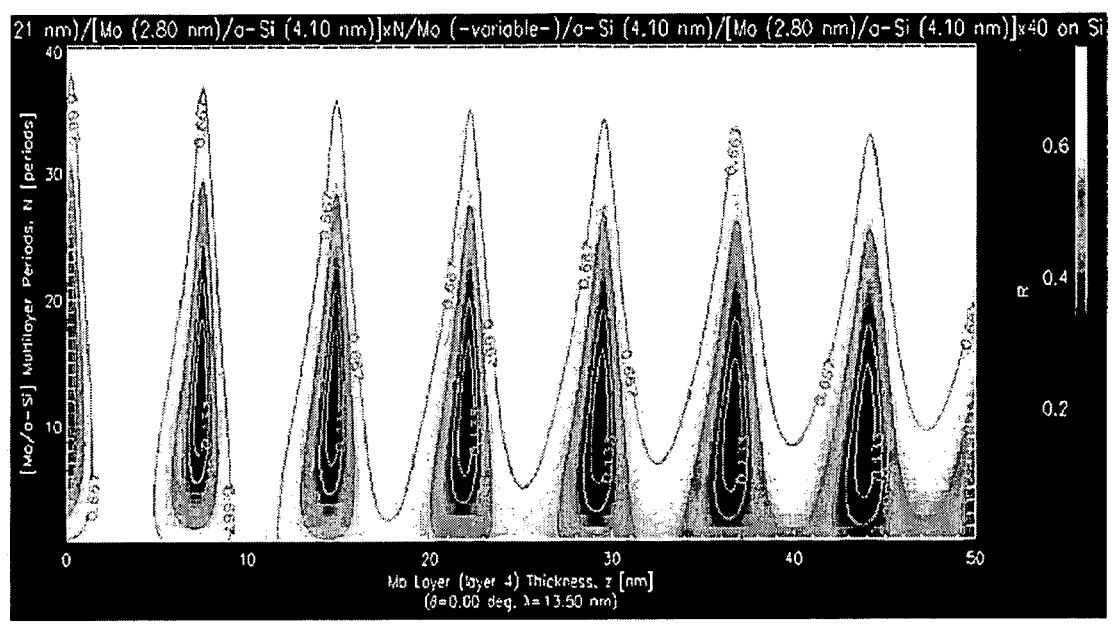
FIGS. 3A through 6H are graphs illustrating experimental results for the reflection mask of FIG. 2, according to an embodiment of the present invention.

FIG. 3A illustrates a graph expressing the number of repeatedly stacked pairs of the Mo and Si layers as the upper reflection layer 28 depending on a change in the thickness ($t_{Mo}$) of the Mo layer serving as the phase reversing layer 26. Table 1 below shows the number of the stacked pairs of the Mo and Si layers and the reflectance R changing depending on the thicknesses of six sample Mo layers. For instance, in the case that the thicknesses of the sample Mo layers are respectively 7.42 nm and 14.73 nm, the numbers of the repeatedly stacked upper reflection layers 28 are 13 and 12, respectively.

TABLE 1

| | $t_{MO}$ | # of bilayers | R |
|---|---|---|---|
| 1 | 7.42 | 13 | 5.7e−4 |
| 2 | 14.73 | 12 | 3.0e−4 |
| 3 | 22.04 | 11 | 2.2e−4 |
| 4 | 29.36 | 10 | 9.6e−4 |
| 5 | 36.37 | 10 | 8.2e−4 |
| 6 | 43.99 | 9 | 4.8e−4 |

Figure 3B:
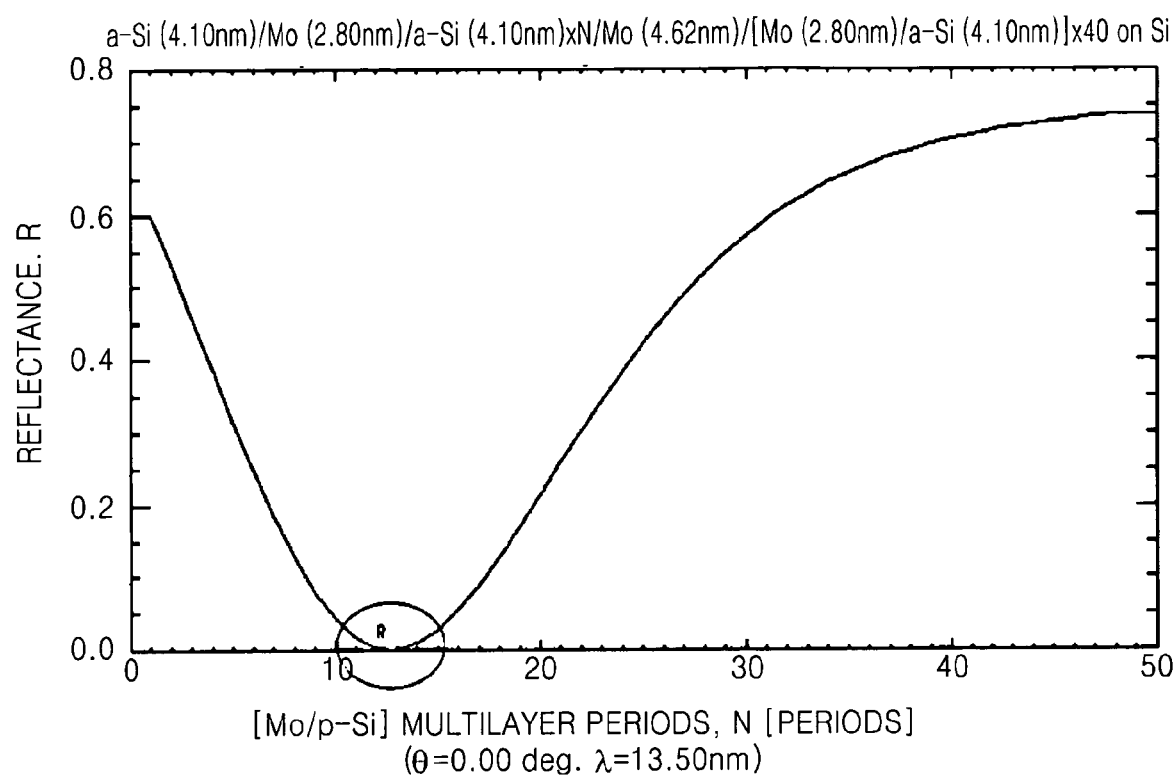
Figure 4A:
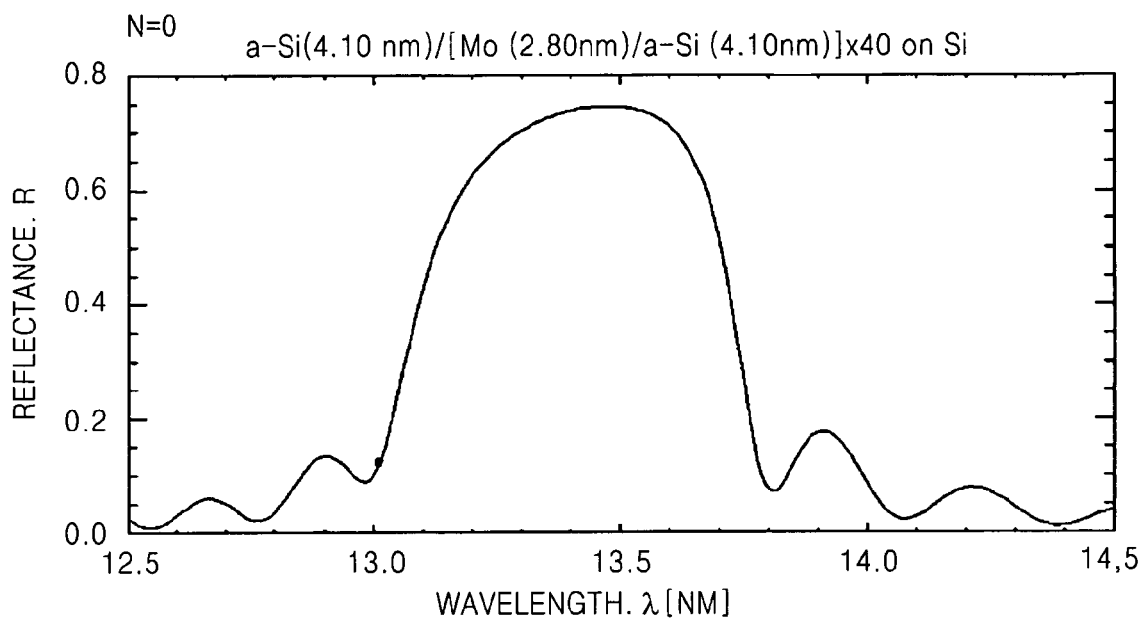
Figure 4B:
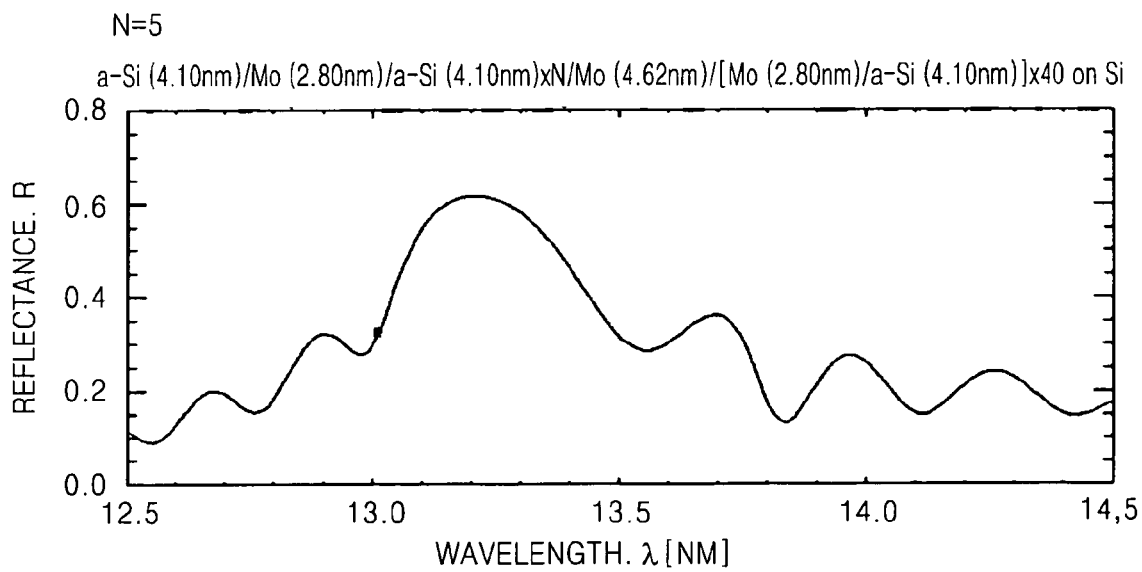
Figure 4C:
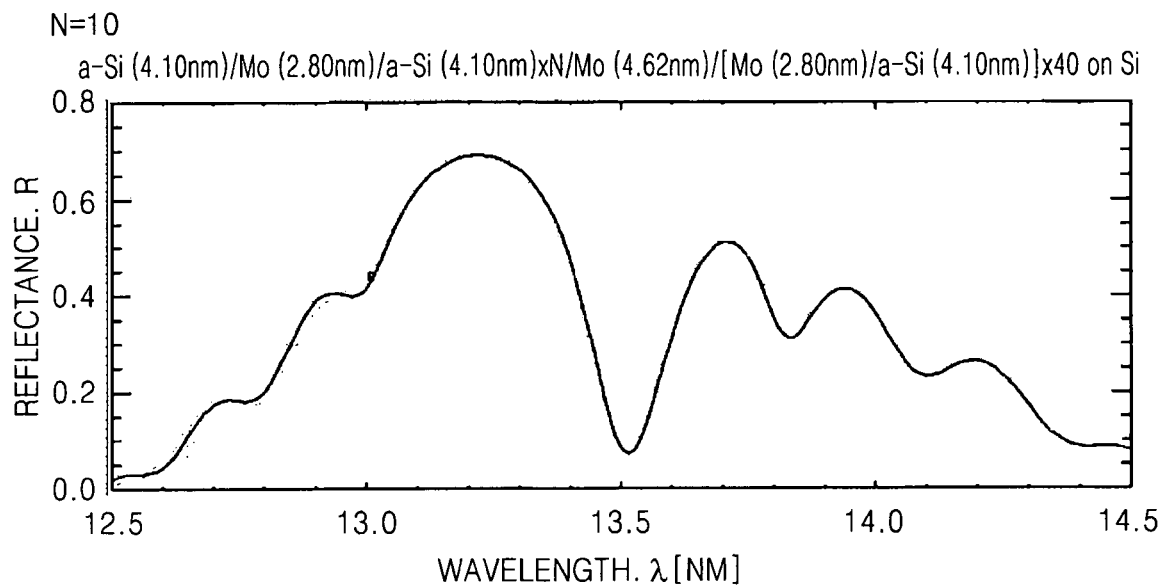
Figure 4D:
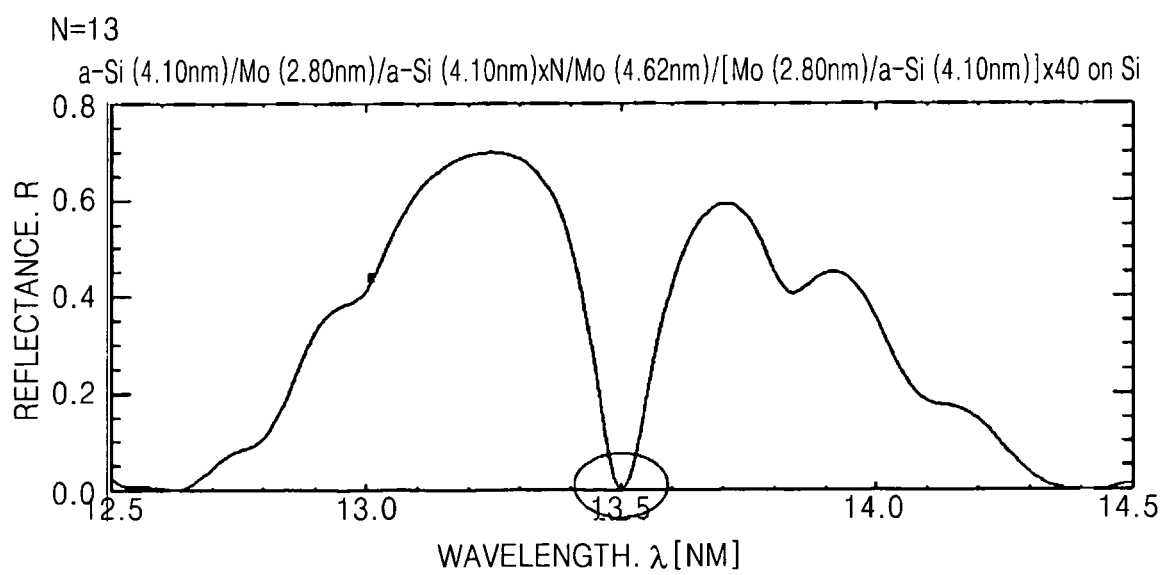
Figure 4E:
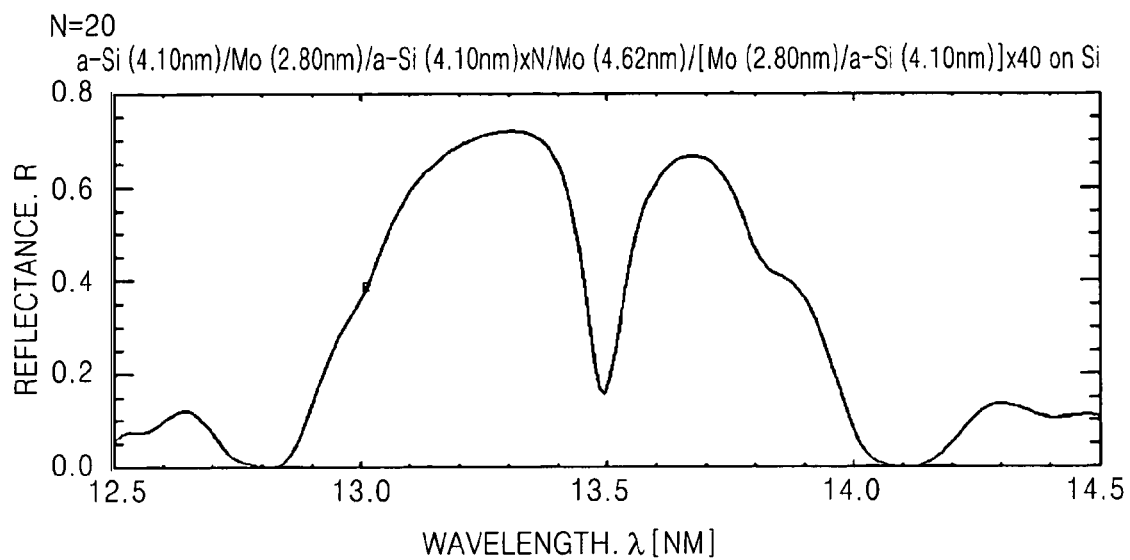
Figure 4F:
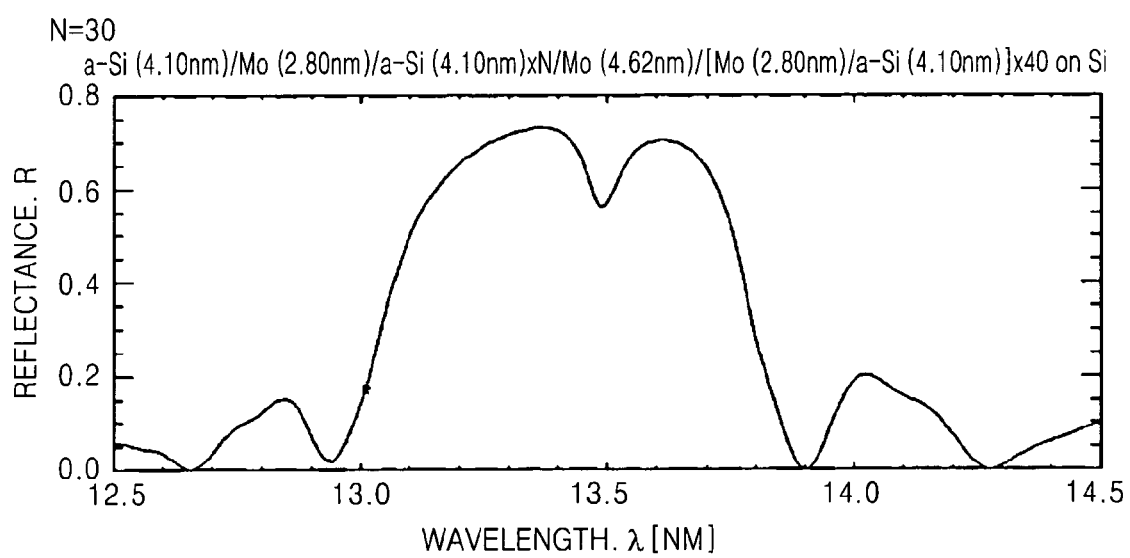
Figure 4G:
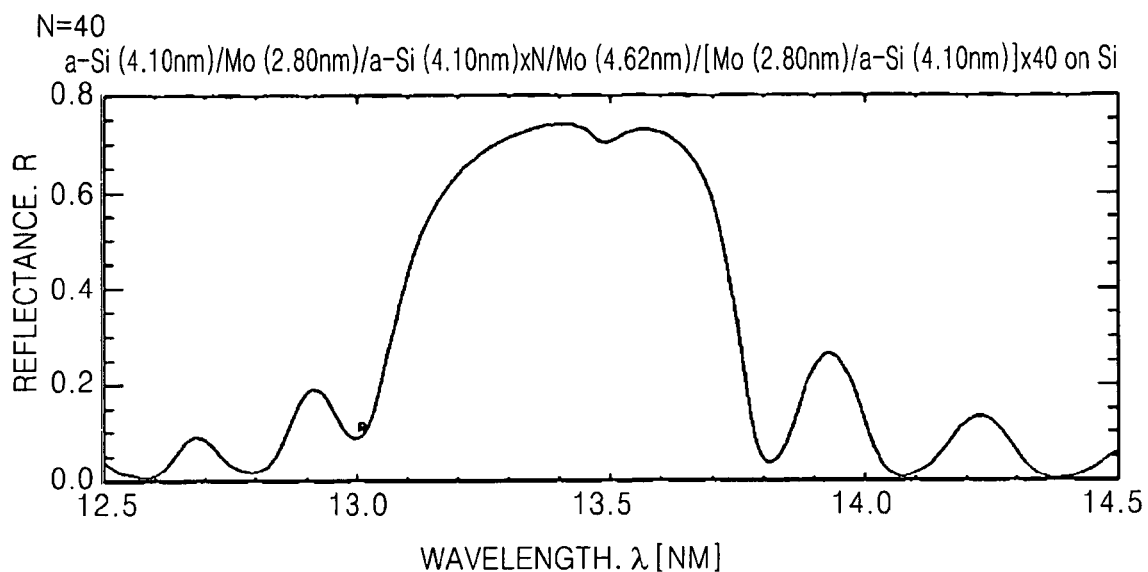
Figure 4H:
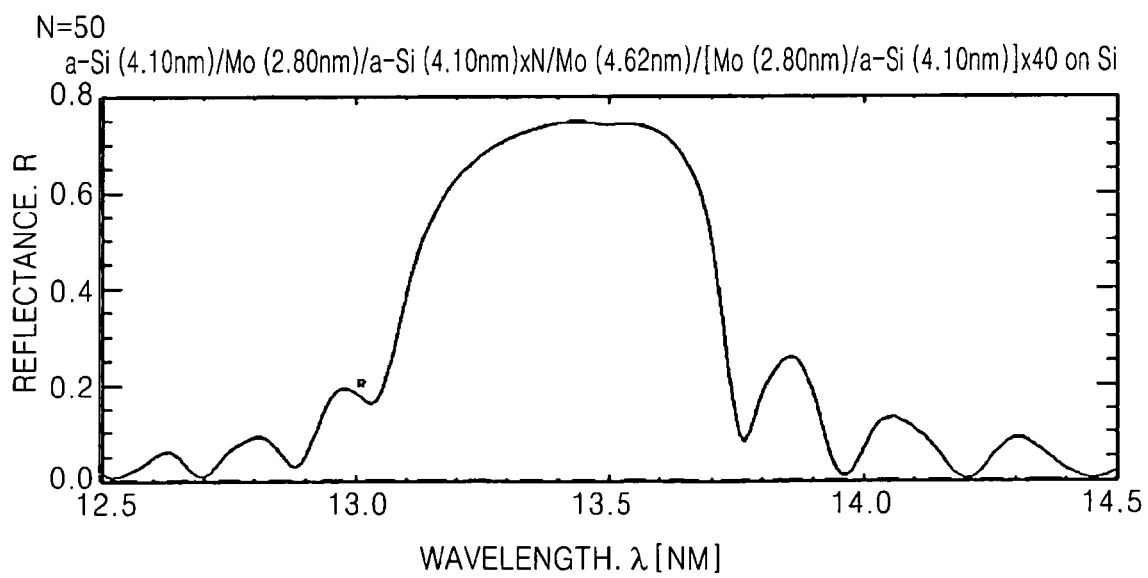

Referring to FIG. 3B, in the case that the thickness of the Mo layer is approximately 7.42 nm, the number of the repeatedly stacked upper reflection layers 28 is approximately 13, and in this case, the reflectance R of EUV light on the surface of the upper reflection layer 28 is close to approximately 0. That is, when N=13 the reflectance is at a minimum.

Referring to FIGS. 4A through 4H, the illustrated graphs show data obtained when the number of the repeatedly stacked upper reflection layers 28 is changed while the thickness of the Mo layer of the phase reversing layer 26 is set to be approximately 7.42 nm, the same as above. When the number of the repeatedly stacked upper reflection layers 28 is approximately 13, the reflectance of EUV light on the surface of the upper reflection layer 28 is approximately equal to 0. Once again, when N=13 the reflectance is at a minimum.

FIGS. 5A through 6H are graphs showing data obtained when a silicon layer is employed as the phase reversing layer 26.

Figure 5A:
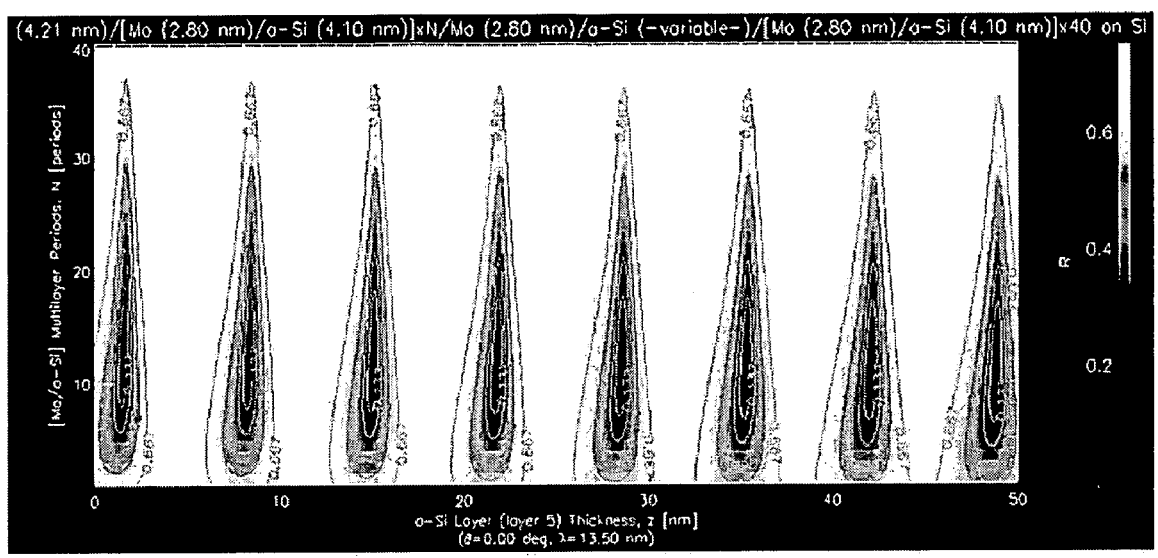

Referring to FIG. 5A, the illustrated graph shows the number of stacked pairs of the Mo and Si layers of the upper reflection layer 28 depending on a change in the thickness ($t_{si}$) of the Si layer serving as the phase reversing layer 26. Table 2 below shows the number of stacked pairs of the Mo and Si layers and reflectance R changing depending on the thicknesses of six sample Si layers. For instance, in the case that the thicknesses of the sample Si layers are respectively 8.31 nm and 15.03 nm, the numbers of the repeatedly stacked upper reflection layers 28 are 14 and 13, respectively.

TABLE 2

| | $t_{Si}$ | # of bilayers | R |
|---|---|---|---|
| 1 | 1.6 | 14 | 6.1e−3 |
| 2 | 8.31 | 14 | 5.1e−4 |
| 3 | 15.03 | 13 | 1.6e−3 |
| 4 | 21.84 | 13 | 4.5e−3 |
| 5 | 28.56 | 12 | 1.2e−5 |
| 6 | 35.27 | 12 | 3.1e−3 |
| 7 | 42.08 | 12 | 1.9e−3 |
| 8 | 48.8 | 11 | 5.5e−4 |

Figure 5B:
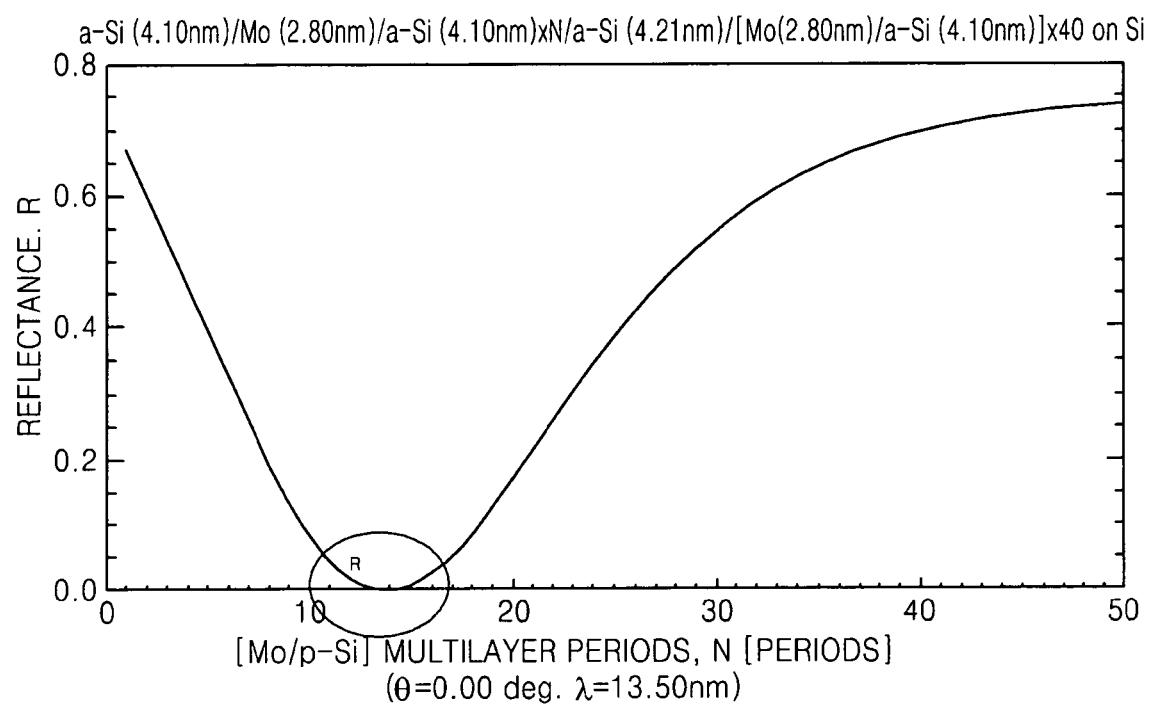
Figure 6A:
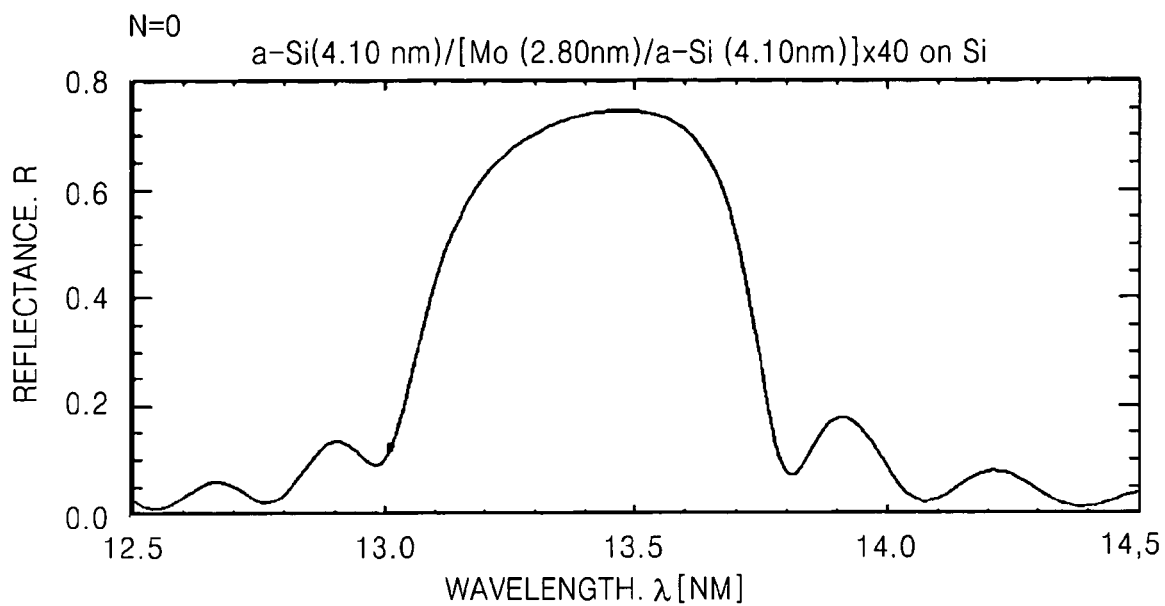
Figure 6B:
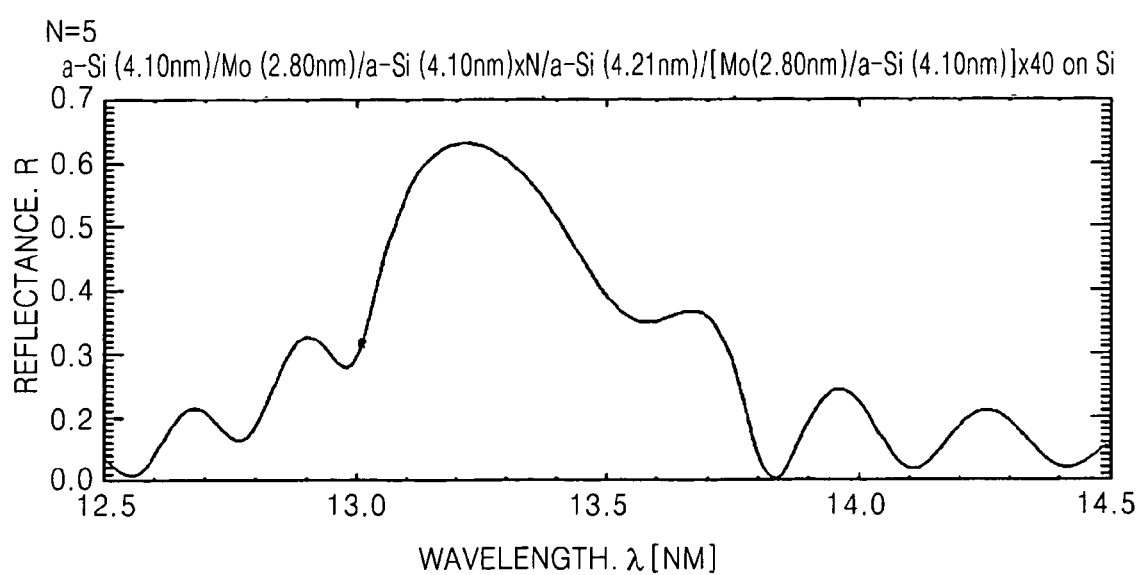
Figure 6C:
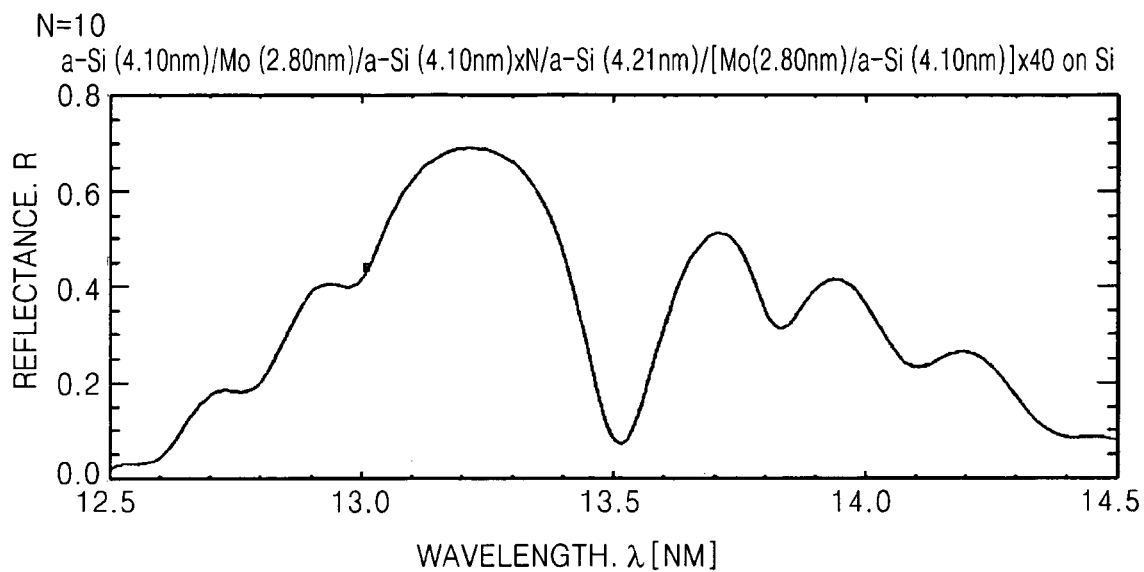
Figure 6D:
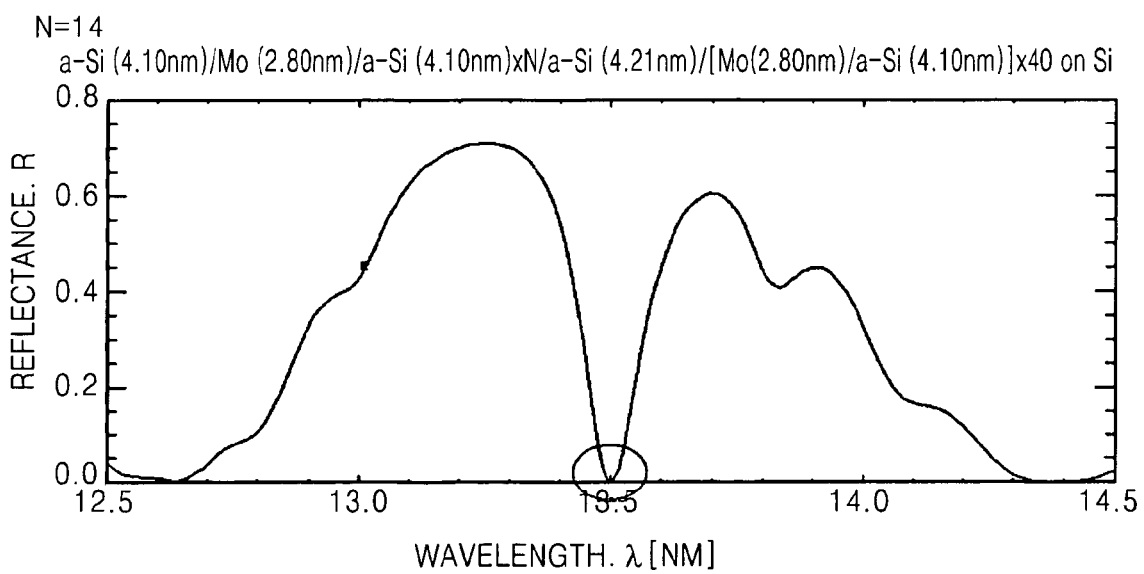
Figure 6E:
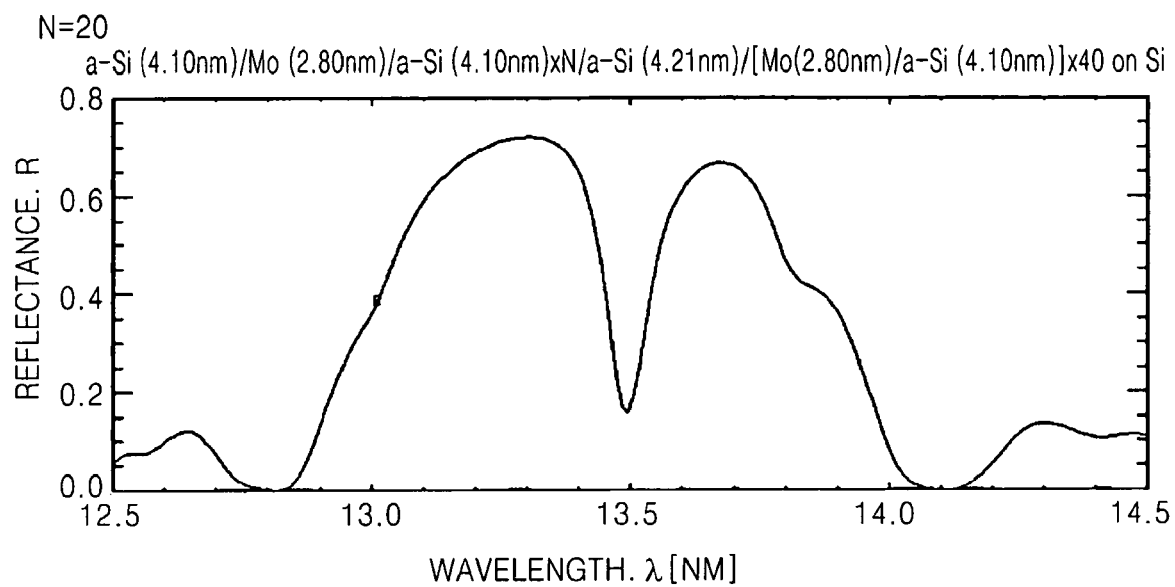
Figure 6F:
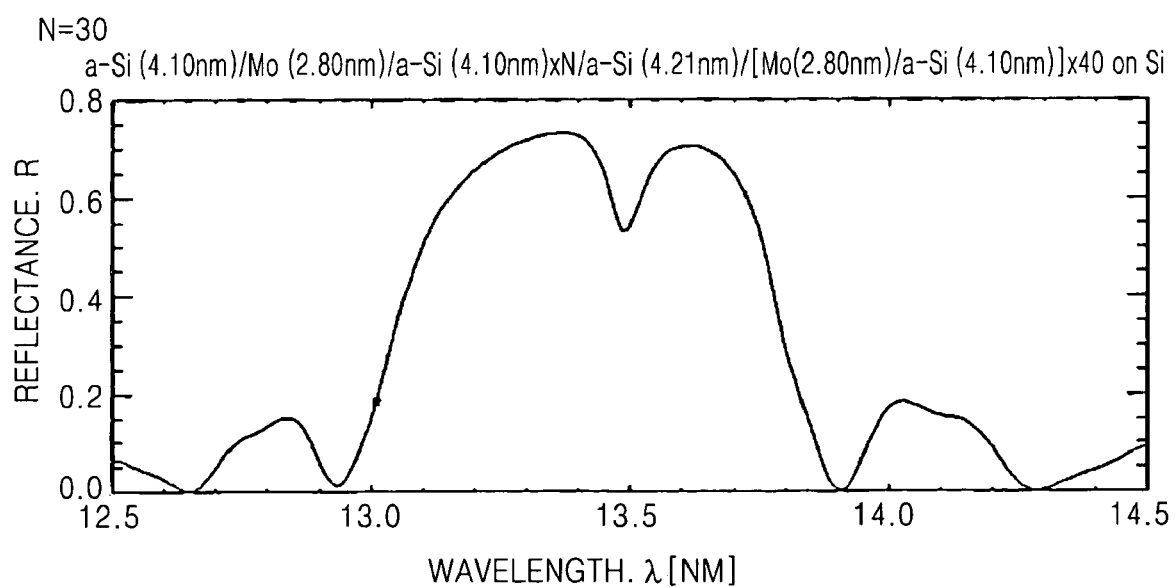
Figure 6G:
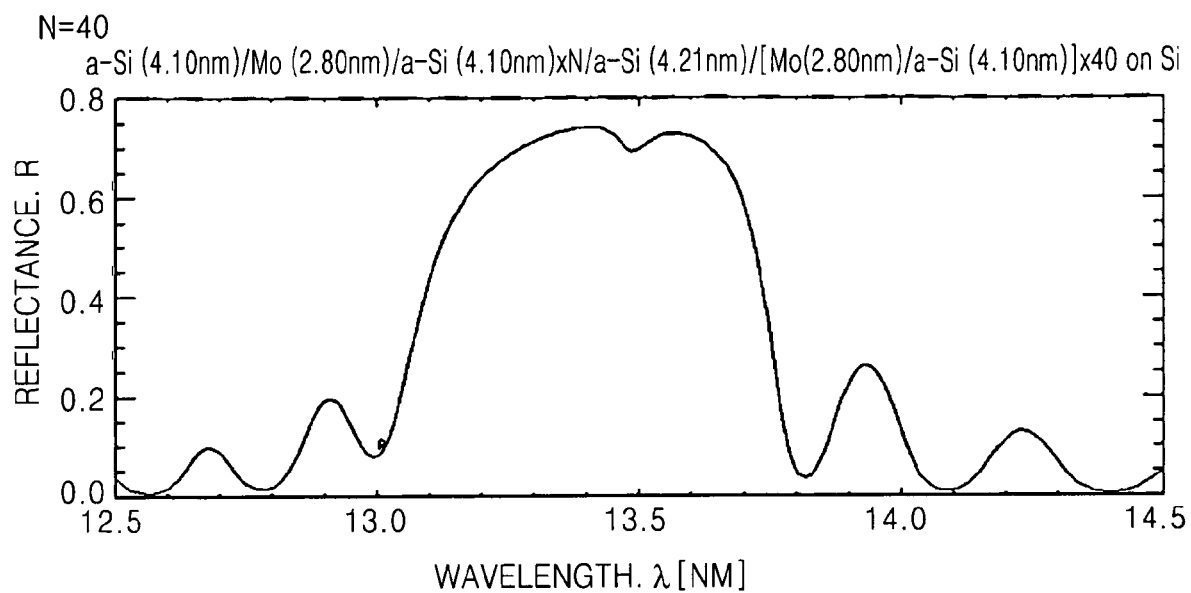
Figure 6H:
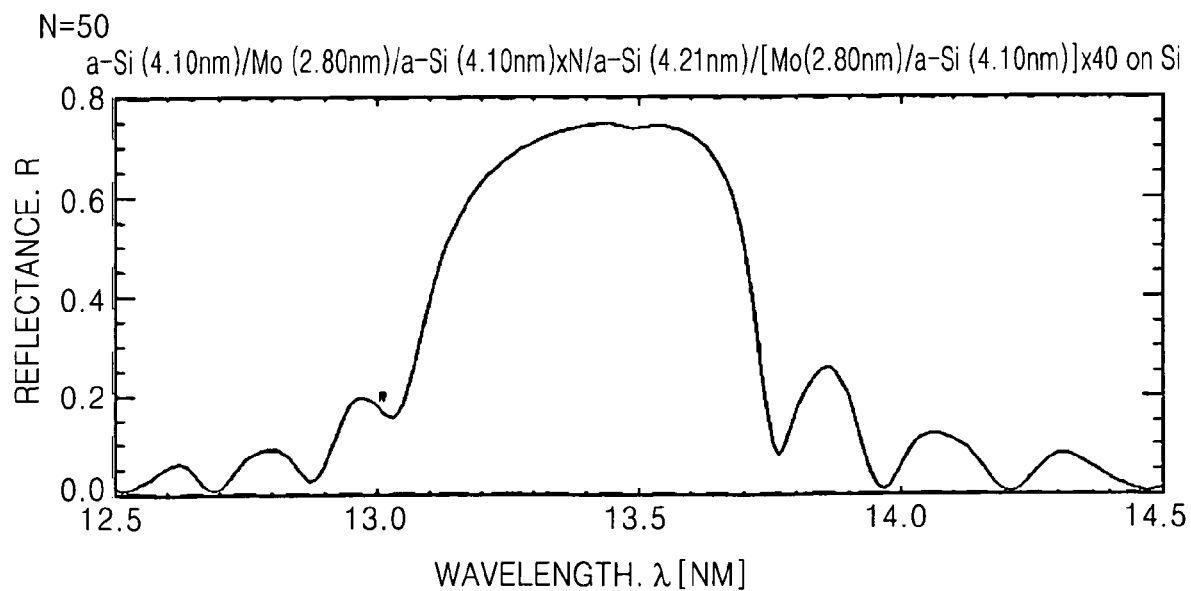

Referring to FIG. 5B, when the thickness of the Si layer is approximately 8.31 nm and the number of the repeatedly stacked upper reflection layers 28 is approximately 14, and the reflectance R of EUV light on the surface of the upper reflection layer 28 is approximately equal to 0. That is, when N=14 the reflectance is at a minimum.

Referring to FIGS. 6A through 6H, the illustrated graphs show data obtained when the number of the repeatedly stacked upper reflection layers 28 is changed under the condition that the thickness of the Si layer of the phase reversing layer 26 is set to be approximately 8.31 nm, the same as above. When the number of the repeatedly stacked upper reflection layers 28 is approximately 14, the reflectance R of EUV light on the surface of the upper reflection layer 28 is approximately equal to 0. Once again, when N=13 the reflectance is at a minimum.

FIGS. 7A through 7F are cross-sectional views illustrating a method of fabricating a reflection mask according to an embodiment of the present invention.

Figure 7A:
FIGS. 7A through 7F are cross-sectional views illustrating a method of fabricating a reflection mask for EUV photolithography according to an embodiment of the present invention.
Figure 7B:
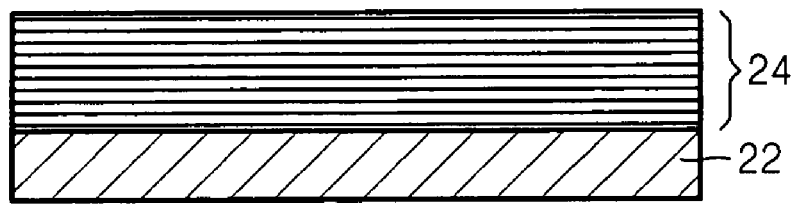

Referring to FIG. 7A, a substrate 22 is prepared. As illustrated in FIG. 7B, a lower reflection layer 24 is formed on the substrate 22. The lower reflection layer 24 is formed in a multi-layer structure of Mo/Si using a radio frequency (RF) magnetron sputtering method or an ion sputtering method for forming a thin film. The sputtering condition changes depending on the employed apparatus.

Figure 7C:
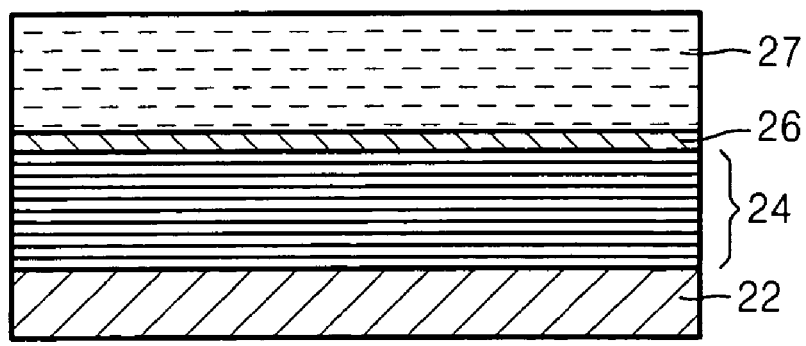

Referring to FIG. 7C, a phase reversing layer 26 is formed on the lower reflection layer 24. The phase reversing layer 26 may include a Mo layer or a Si layer. A photoresist layer 27 is formed on the phase reversing layer 26.

Figure 7D:
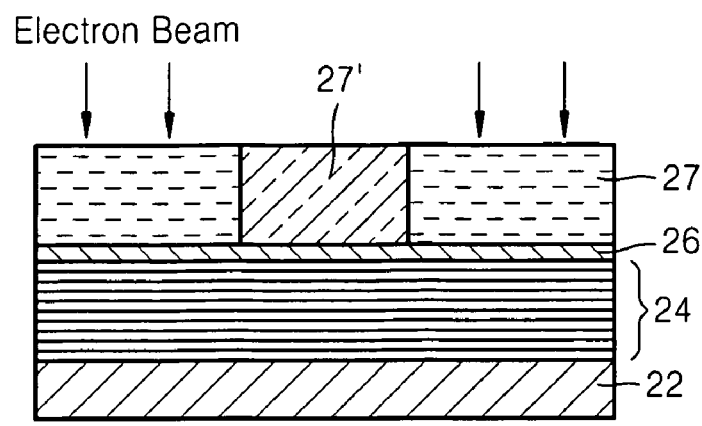

Referring to FIG. 7D, the photoresist layer 27 is exposed to an electron beam to form a predetermined photoresist pattern 27' on the phase reversing layer 26.

Figure 7E:
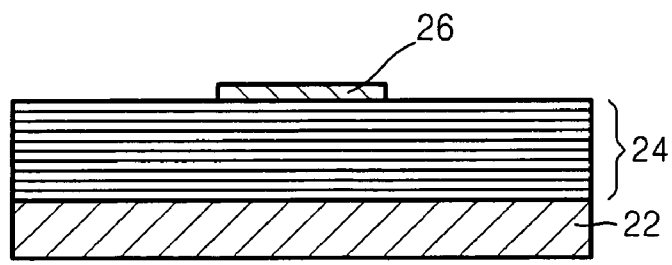

Referring to FIG. 7E, an etching process is performed using the photoresist pattern 27' as a mask to form the phase reversing layer 26 in a predetermined pattern.

Figure 7F:
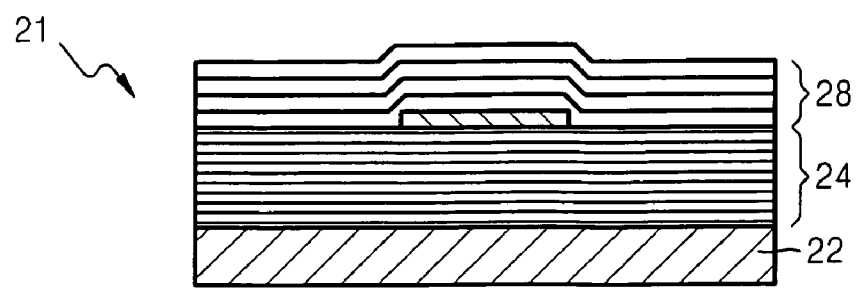

Referring to FIG. 7F, an upper reflection layer 28 is formed on the phase reversing layer 26 having the predetermined pattern and on the exposed portions of the lower reflection layer 24. The upper reflection layer 28 is formed in a multi-layer structure of Mo/Si. Following this procedure, the reflection mask 21 for EUV photolithography including the phase reverse layer 26 is provided.

According to embodiments of the present embodiment, EUV light reflected from the surface of the lower reflection layer 24 and then transmitted through the phase reverse layer 26 and EUV light reflected from the surface of the upper reflection layer 28 are eliminated by canceling each other out via destructive interference and, thus, the pattern on the reflection mask 21 is projected precisely on the photoresist layer covering the thin film 32 on, the silicon wafer 30, as shown in FIG. 2.

Since the height of the phase reversing layer 26 is small, the shadow effect generally occurring due to the large height of the typical absorption material pattern is not observed. As a result, the photoresist pattern 34 can be formed more precisely than in the conventional case. In more detail, since the reflection region and the destructive interference region for EUV light are clearly defined, the photoresist pattern 34 can be formed in the desired pattern. Hence, the reflection mask 21 can have an improved function in a photolithography process.

According to exemplary embodiments of the present invention, the phase reversing layer is formed on a predetermined region of the reflection layer. Thus, the shadow effect is less likely to occur and unnecessary EUV light can be eliminated. As a result, the pattern designed on the mask can be projected precisely on the silicon wafer substantially in the same shape as the designed pattern.

Since the phase reversing layer is formed of a material substantially the same as a material for the reflection layer and the absorption layer, fabrication processes thereof can be handled easily.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A reflection mask for extreme ultraviolet (EUV) photolithography, the reflection mask having a reflection region and a non-reflection region and comprising:

a substrate;

a lower reflection layer formed in a multi-layer structure on the substrate, covering the reflection region and the non-reflection region, and including a material that reflects EUV light directed over the reflection region and the non-reflection region;

an upper reflection layer formed in a multi-layer structure on the lower reflection layer, covering the reflection region and the non-reflection region, and capable of reflecting EUV light directed over the reflection region and the non-reflection region; and a phase reversing layer formed in the non-reflection region in a predetermined pattern and arranged between the lower reflection layer and the upper reflection layer and causing destructive interference between light reflected from the upper reflection layer and light reflected from the lower reflection layer.

2. The reflection mask of claim 1, wherein the upper reflection layer and the lower reflection layer are formed by repeatedly forming two or more layers having different refraction indices, wherein the two or more layers are formed of molybdenum (Mo) and silicon (Si).

3. The reflection mask of claim 1, wherein the phase reversing layer is formed to have a phase difference between EUV light reflected from the lower reflection layer and EUV light reflected from the upper reflection layer of approximately 180 degrees.

4. The reflection mask of claim 3, wherein the phase reversing layer has one of a single layer structure and a multi-layer structure.

5. The reflection mask of claim 4, wherein the phase reversing layer includes one selected from the group consisting of a single molybdenum (Mo) layer, a single silicon (Si) layer, and a multi-layer structure of Mo/Si.

6. The reflection mask of claim 4, wherein the phase reversing layer has a thickness less than approximately 100 nm.

7. A method of fabricating a reflection mask for extreme ultraviolet (EUV) photolithography, the reflection mask having a reflection region and a non-reflection region, and the method comprising:

preparing a substrate;

forming a lower reflection layer in a multi-layer structure on the substrate, covering the reflection region and the non-reflection region, using a material that reflects EUV light directed over the reflection region and the non-reflection region;

forming a phase reversing layer in the non-reflection region in a predetermined pattern on the lower reflection layer; and forming an upper reflection layer in a multi-layer structure, covering the reflection region and the non-reflection region, on the phase reversing layer and on exposed portions of the lower reflection layer.

8. The method of claim 7, wherein the forming of the phase reversing layer in the certain pattern comprises:

forming the phase reversing layer on a predetermined portion of the lower reflection layer;

forming a photoresist layer on the phase reversing layer;

patterning the photoresist layer to form a photoresist pattern;

performing an etching process on the phase reversing layer using the photoresist pattern as a mask; and removing the photoresist pattern so as to form the phase reversing layer on a portion of the lower reflection layer less than the predetermined portion.

9. The method of claim 7, wherein each of the upper reflection layer and the lower reflection layer are formed by repeatedly and alternately stacking a molybdenum (Mo) layer and a silicon (Si) layer over each other.

10. The method of claim 8, wherein the phase reversing layer is formed by using one of a single molybdenum (Mo) layer and a single silicon (Si) layer.

11. The method of claim 8, wherein the phase reversing layer is formed by repeatedly and alternately stacking a Mo layer and a Si layer over each other.

12. The method of claim 7, wherein the upper and lower reflection layers, the phase reversing layer, and an absorption layer are formed using one selected from the group consisting of a DC (direct current) magnetron sputtering method, a RF (radio frequency) magnetron sputtering method and an ion beam sputtering method.

* * * * *